(12) United States Patent
Inada et al.

(10) Patent No.: US 7,782,284 B2
(45) Date of Patent: Aug. 24, 2010

(54) VIDEO SIGNAL LINE DRIVE CIRCUIT, AND DISPLAY DEVICE HAVING THE CIRCUIT

(75) Inventors: Ken Inada, Oxford (GB); Takuya Tsuda, Abiko (JP); Toshihiro Yanagi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 656 days.

(21) Appl. No.: 11/632,056

(22) PCT Filed: Jul. 11, 2005

(86) PCT No.: PCT/JP2005/012789

§ 371 (c)(1),
(2), (4) Date: Jul. 24, 2007

(87) PCT Pub. No.: WO2006/009005

PCT Pub. Date: Jan. 26, 2006

(65) Prior Publication Data

US 2007/0279402 A1    Dec. 6, 2007

(30) Foreign Application Priority Data

Jul. 16, 2004    (JP) .............................. 2004-210385

(51) Int. Cl.
G09G 3/36    (2006.01)

(52) U.S. Cl. .................... 345/89; 345/98; 345/103; 345/690; 345/616

(58) Field of Classification Search ............... 345/89, 345/90, 98–100, 103, 690, 616
See application file for complete search history.

(56) References Cited

U.S. PATENT DOCUMENTS

| | | | |
|---|---|---|---|
| 5,418,626 A | * | 5/1995 | Semasa .................. 358/451 |
| 5,870,503 A | * | 2/1999 | Kumashiro ................ 382/252 |
| 6,075,508 A | * | 6/2000 | Ono et al. .................... 345/98 |
| 6,529,181 B2 | * | 3/2003 | Nakano et al. ............... 345/98 |
| 6,563,486 B2 | * | 5/2003 | Otobe et al. ................ 345/690 |

(Continued)

FOREIGN PATENT DOCUMENTS

AU    199453115    1/1994

(Continued)

OTHER PUBLICATIONS

International Search Report (PCT/ISA/210), Aug. 16, 2005.

*Primary Examiner*—Henry N Tran
(74) *Attorney, Agent, or Firm*—Harness, Dickey & Pierce P.L.C.

(57) ABSTRACT

The present invention relates to a video signal line drive circuit of a display device.

An object of the present invention is to, when gradation conversion is performed in the display device using an error diffusion method, provide a display with a smooth gradation change even at boundaries of display blocks.

In an error diffusion operation circuit (36) of a source driver unit (302), an error diffusion process is performed for each pixel based on, in addition to image data (Da) for a display block of the source driver unit (302), image data (Da) for areas near boundaries between the display block of the source driver unit (302) and display blocks of source driver units (301, 303) in previous and subsequent stages. A video signal is generated based on error-diffused image data (Db) generated by the error diffusion process.

4 Claims, 9 Drawing Sheets

U.S. PATENT DOCUMENTS 6,965,358 B1 * 11/2005 Kasahara et al. .............. 345/63
2001/0002124 A1    5/2001 Mamiya et al.

FOREIGN PATENT DOCUMENTS

| | | |
|---|---|---|
| AU | 199453115 | 7/1994 |
| JP | 05-328265 | 12/1993 |
| JP | 06-010991 | 2/1994 |
| JP | 6-301364 | 10/1994 |
| JP | 06-301364 | 10/1994 |
| JP | 10-028248 | 1/1998 |
| JP | 2004-145353 | 5/2004 |

* cited by examiner

BOUNDARY BETWEEN DISPLAY BLOCKS

VIDEO SIGNAL LINE DRIVE CIRCUIT, AND DISPLAY DEVICE HAVING THE CIRCUIT

TECHNICAL FIELD

The present invention relates to a display device, and particularly to a video signal line drive circuit that uses an error diffusion method to provide a pseudo multi-gradation display.

BACKGROUND ART

In recent years, there have been needs to increase the size and resolution of image display devices such as liquid crystal display devices, and the number of scanning signal lines and the number of video signal lines are increasing compared to the numbers used conventionally. As a result, it has become difficult to drive an image display device with one gate driver IC (an IC for driving the scanning signal lines) and one source driver IC (an IC for driving the video signal lines). Therefore, there have been provided image display devices including a plurality of gate driver ICs and a plurality of source driver ICs.

In some above-mentioned image display devices, the number of gradations that can be displayed by such an image display device may be less than the number of gradations in externally provided image data representing an image that is to be displayed (hereinafter, referred to as "original image data"). In such a case, fine differences between gradations in the image representing the original image cannot be represented, and therefore it is not possible to obtain satisfactory image quality. Accordingly, as known approaches for the pseudo multi-gradation display, ordered dithering and the error diffusion method have been used conventionally. According to the error diffusion method, an error between a gradation level represented by original image data and a gradation level actually used by an image display device for displaying the original image data is diffused from each pixel to its neighboring pixels. As a result, even if the number of gradations that can be displayed by the image display device is small, the pseudo multi-gradation display is provided to realize an image display with smoothly changing gradations. Note that a minimum unit of an image displayed on a screen is referred to herein as a "pixel". In addition, an individual gate driver IC is referred to as a "gate driver unit (a scanning signal line drive unit)", and an individual source driver IC is referred to as a "source driver unit (a video signal line drive unit)". Furthermore, a circuit composed of a plurality of gate driver units or a plurality of source driver units and having a function of driving all scanning signal lines or video signal lines is referred to as a "gate driver (a scanning signal line drive circuit)" or a "source driver (a video signal line drive circuit)".

Conversion of image data by the error diffusion method will be described below by taking as an example a case where original image data composed of pixel data in which each pixel is represented by eight bits is converted into pixel data in which each pixel is represented by one bit (hereinafter, the data resulted from the conversion is referred to as "display image data"). In this example, each piece of pixel data contained in the original image data is composed of eight bits, and therefore the number of gradations represented by the pixel data contained in the original image data is 256. On the other hand, each piece of pixel data contained in the display image data is composed of one bit, and therefore the number of gradations represented by the pixel data contained in the display image data is 2. For convenience of explanation, the gradation level represented by each piece of pixel data contained in the original image data is referred to as an "original image gradation level" and represented by 0 h to 255 h. In addition, the gradation level represented by each piece of pixel data contained in the display image data is referred to as a "display image gradation level" and represented by 0 k or 1 k.

Described first is conversion from the original image gradation level to the display image gradation level (hereinafter, referred to as "gradation conversion"). At the time of gradation conversion, the original image gradation level of each pixel is compared to a threshold (in this case, "128"). As a result, if the original image gradation level is 128 h or lower, the display image gradation level becomes 0 k. On the other hand, if the original image gradation level is 129 h or higher, the display image gradation level becomes 1 k. Here, supposing that an original image gradation level corresponding to a display image gradation level is represented by L(K), L(0 k) is 0 h, and L(1 k) is 255 h.

Next, referring to FIGS. 7A and B of FIG. 7B, an error caused by the gradation conversion is described. FIG. 7A is a representation for explaining an error in the case of an original image gradation level of 200 h. When the original image gradation level is 200 h, the display image gradation level is 1 k. In this case, L(K) is 255 h, and therefore a gradation level error corresponding to "200 h to 255 h" occurs as shown in part FIG. 7A. FIG. 7B is a representation for explaining an error in the case of an original image gradation level of 80 h. When the original image gradation level is 80 h, the display image gradation level is 0 k. In this case, L(K) is 0 h, and therefore a gradation level error corresponding to "80 h to 0 h" occurs as shown in FIG. 7B.

The error caused as described above is diffused from each pixel to predetermined pixels among its neighboring pixels at predetermined allocation rates. Such a process for diffusing the error is referred to as an "error diffusion process", which is described below. FIG. 8 is a diagram for explaining the error diffusion process. In FIG. 8, the rectangle denoted by reference character Ga0 represents a pixel on a display screen (hereinafter, referred to as the "pixel of interest"), and the rectangles denoted by reference characters Ga1 to Ga4 represent right, lower left, underlying and lower right pixels, respectively, with respect to the pixel of interest. In addition, the coordinates of the pixel of interest Ga0 are represented by (i,j), and its original image gradation level is represented by f(i,j). In this case, an error $Er(i,j)$ that occurs to the pixel of interest Ga0 at the time of gradation conversion is represented by the following equation (1).

$$Er(i,j)=f(i,j)-L(K) \quad (1)$$

Note that in the above equation (1), K is a display image gradation level of the pixel of interest Ga0 converted from the original image gradation level f(i,j).

The above-mentioned error $Er(i,j)$ is diffused to the pixels Ga1 to Ga4 by the error diffusion process as shown in FIG. 8. The gradation levels of the pixels Ga1 to Ga4 after the error diffusion process are represented by the following equations (2) to (5), respectively.

$$F(i+1,j)=f(i+1,j)+Er(i,j)\times M1 \quad (2)$$

$$F(i-1,j+1)=f(i-1,j+1)+Er(i,j)\times M2 \quad (3)$$

$$F(i,j+1)=f(i,j+1)+Er(i,j)\times M3 \quad (4)$$

$$F(i+1,j+1)=f(i+1,j+1)+Er(i,j)\times M4 \quad (5)$$

In the above equations (2) to (5), M1 to M4 are coefficients representing the allocation rates for diffusing the error $Er(i,j)$, which is caused to the pixel Ga0, to the pixels Ga1 to Ga4 (hereinafter, such coefficients are referred to as "diffusion coefficients"). For example, M1 to M4 are set to values such as 7/16, 3/16, 5/16 and 1/16.

The following description focuses on the point that errors of neighboring pixels are added to the original image gradation level of each pixel. FIG. 9 is a diagram for explaining addition of errors to the original image gradation level of a pixel. Looking at a pixel Ga10, errors caused to pixels Ga11 to Ga14 are added to the original image gradation level of the pixel Ga10 as shown in FIG. 9. Here, when a value obtained by multiplying the error caused to the pixel Ga11 by a diffusion coefficient for diffusing the error to the pixel Ga10 is represented by er11 (similar for the pixels Ga12 to Ga14), a gradation level of the pixel Ga10 after the addition of the errors is represented by the following equation (6). Note that f is an original image gradation level of the pixel Ga10.

$$F = f + er11 + er12 + er13 + er14 \qquad (6)$$

For all pixels, the error diffusion process is performed in parallel to the gradation conversion as described above.

FIG. 10 is a diagram schematically illustrating an example of a display screen, which is provided in the case where the above-described error diffusion process is applied to an image display device having a source driver composed of a plurality of source driver units. The image display device includes three source driver units 301, 302 and 303, which drive video signal lines to display an image on their respective regions each corresponding to one third of the entire display screen (hereinafter, each region is referred to as a "display block"). In this case, vertically running lines as denoted by reference character Z in FIG. 10 (hereinafter, referred to as "vertical stripes") are visually recognized at boundaries of display blocks. This is described with reference to FIG. 11.

FIG. 11 is a diagram for explaining the error diffusion process at a boundary of a display block. Looking at the pixel Ga10 in FIG. 11, the gradation level F of the pixel Ga10 after addition of errors should be a value as represented by the above equation (6). However, at the boundary of the display block, the gradation level F of the pixel Ga10 cannot be added with the error er11 of the pixel Ga11 and the error er14 of the pixel Ga14. Thus, at the boundary of the display block, the errors caused at the time of gradation conversion are not diffused beyond the boundary, and therefore vertical stripes are visually recognized.

Japanese Laid-Open Patent Publication No. 5-328265 discloses a liquid crystal display device in which the vertical stripe is suppressed from being visually recognized on a display screen, the vertical stripe caused by that a source driver is composed of a plurality of source driver units. In this liquid crystal display device, the difference in sampling voltage between the source driver units is corrected by changing a source voltage value of a drive unit, and therefore any vertical stripe as described above is suppressed from occurring.

[Patent Publication 1] Japanese Laid-Open Patent Publication No. 5-328265

DISCLOSURE OF THE INVENTION

Problems to be Solved by the Invention

The liquid crystal display device disclosed in Japanese Laid-Open Patent Publication No. 5-328265 suppresses vertical stripes from occurring at boundaries of display blocks, if the cause of the stripes is that characteristics of sampling circuits for performing preliminary sampling on an input video signal vary between the source driver units. However, as described above, it does not suppress vertical stripes that are caused due to that errors caused at the time of gradation conversion are not diffused beyond the boundaries of the display blocks.

Therefore, an object of the present invention is to, in an image display device in which a source driver is composed of a plurality of source driver units, suppress vertical stripes, which may be caused by the error diffusion process, from occurring at boundaries of display blocks of the source driver units.

Means for Solving the Problems

A first aspect of the present invention is directed to a video signal line drive circuit connected to a display portion for displaying an image, the circuit comprising a plurality stage of video signal line drive units for converting, by an error diffusion method, a gradation level indicated by an externally inputted image signal representing an original image, and applying a video signal indicating a gradation level after the conversion to video signal lines each included in a predetermined area of the display portion, wherein each video signal line drive unit includes an error diffusion operation circuit for generating a video signal that is to be applied to self-stage area video signal lines, which are video signal lines connected to self-stage, based on self-stage area image data and at least either previous stage area image data or subsequent stage area image data, the self-stage area image data being image data representing the original image for the video signal that is to be applied to the self-stage area video signal lines, the previous stage area image data being image data representing the original image for the video signal that is to be applied to previous stage area video signal lines, which are a predetermined number of near-boundary video signal lines among all video signal lines connected to the video signal line drive unit in a previous stage, the subsequent stage area image data being image data representing the original image for the video signal that is to be applied to subsequent stage area video signal lines, which are a predetermined number of near-boundary video signal lines among all video signal lines connected to the video signal line drive unit in a subsequent stage.

In a second aspect of the present invention, based on the first aspect of the present invention, each video signal line drive unit is cascaded to a video signal line drive unit in a previous stage and a video signal line drive unit in a subsequent stage, the error diffusion operation circuit included in each video signal line drive unit includes a timing signal generation section for receiving a first timing signal, which is activated at a predetermined time, and generating a second timing signal for timing to sample the video signal that is to be applied to the self-stage area video signal lines, and a third timing signal that is received as the first timing signal by the video signal line drive unit in the subsequent stage, the second timing signal is activated after a lapse of a time period corresponding to a time period elapsed after the first timing signal is activated in which the error diffusion operation circuit receives the previous stage area image data and thereafter a portion of the image signal representing the original image that corresponds to one pixel is converted by the error diffusion method, the third timing signal is activated after a lapse of a time period corresponding to a time period elapsed after the first timing signal is activated in which the error diffusion operation circuit receives the self-stage area image data, and a process for converting the gradation level indicated by the image signal representing the original image by the error diffusion method is started synchronously with the time at which the first timing signal is activated.

A third aspect of the present invention is directed to a display device a display device comprising: a display portion for displaying an image; and a video signal line drive circuit connected to the display portion and composed of a plurality stage of video signal line drive units for converting, by an error diffusion method, a gradation level indicated by an externally inputted image signal representing an original image, and applying a video signal indicating a gradation level after the conversion to video signal lines each included in a predetermined area of the display portion, wherein each video signal line drive unit includes an error diffusion operation circuit for generating a video signal that is to be applied to self-stage area video signal lines, which are video signal lines connected to self-stage, based on self-stage area image data and at least either previous stage area image data or subsequent stage area image data, the self-stage area image data being image data representing the original image for the video signal that is to be applied to the self-stage area video signal lines, the previous stage area image data being image data representing the original image for the video signal that is to be applied to previous stage area video signal lines, which are a predetermined number of near-boundary video signal lines among all video signal lines connected to the video signal line drive unit in a previous stage, the subsequent stage area image data being image data representing the original image for the video signal that is to be applied to subsequent stage area video signal lines, which are a predetermined number of near-boundary video signal lines among all video signal lines connected to the video signal line drive unit in a subsequent stage.

In a fourth aspect of the present invention, based on the third aspect of the present invention, each video signal line drive unit is cascaded to a video signal line drive unit in a previous stage and a video signal line drive unit in a subsequent stage, the error diffusion operation circuit included in each video signal line drive unit includes a timing signal generation section for receiving a first timing signal, which is activated at a predetermined time, and generating a second timing signal for timing to sample the video signal that is to be applied to the self-stage area video signal lines, and a third timing signal that is received as the first timing signal by the video signal line drive unit in the subsequent stage, the second timing signal is activated after a lapse of a time period corresponding to a time period elapsed after the first timing signal is activated in which the error diffusion operation circuit receives the previous stage area image data and thereafter a portion of the image signal representing the original image that corresponds to one pixel is converted by the error diffusion method, the third timing signal is activated after a lapse of a time period corresponding to a time period elapsed after the first timing signal is activated in which the error diffusion operation circuit receives the self-stage area image data, and a process for converting the gradation level indicated by the image signal representing the original image by the error diffusion method is started synchronously with the time at which the first timing signal is activated.

Advantages of the Invention

According to the first aspect of the present invention, in each video signal line drive unit, a video signal is generated based on image data representing an original image for a video signal that is to be applied to video signal lines connected to that unit, image data representing an original image for a video signal that is to be applied to near-boundary portions of all video signal lines connected to a video signal line drive unit in the previous stage, and image data representing an original image for a video signal that is to be applied to near-boundary portions of all video signal lines connected to a video signal line drive unit in the subsequent stage. Accordingly, even at boundaries of the video signal line drive units, an error caused to each pixel at the time of gradation conversion is diffused to its neighboring pixels. Thus, it is possible to realize a display with a smooth gradation change even at the boundaries of the video signal line drive units.

According to the second aspect of the present invention, when the error diffusion operation circuit is configured to include the timing signal generation section, a time to start a conversion process by an error diffusion method and a time to sample a video signal that is to be applied to video signal lines are determined in accordance with first to third timing signals. Accordingly, by adjusting the timing of activating each timing signal, it is possible to determine which image data should be used by the video signal line drive units for generating a video signal that is to be applied to their respective self-stage area video signal lines. Thus, by simply changing the configuration of the timing signal generation section, it is made possible to realize a display with a smooth gradation change at the boundaries of the video signal line drive units.

LEGEND

Figure 1:
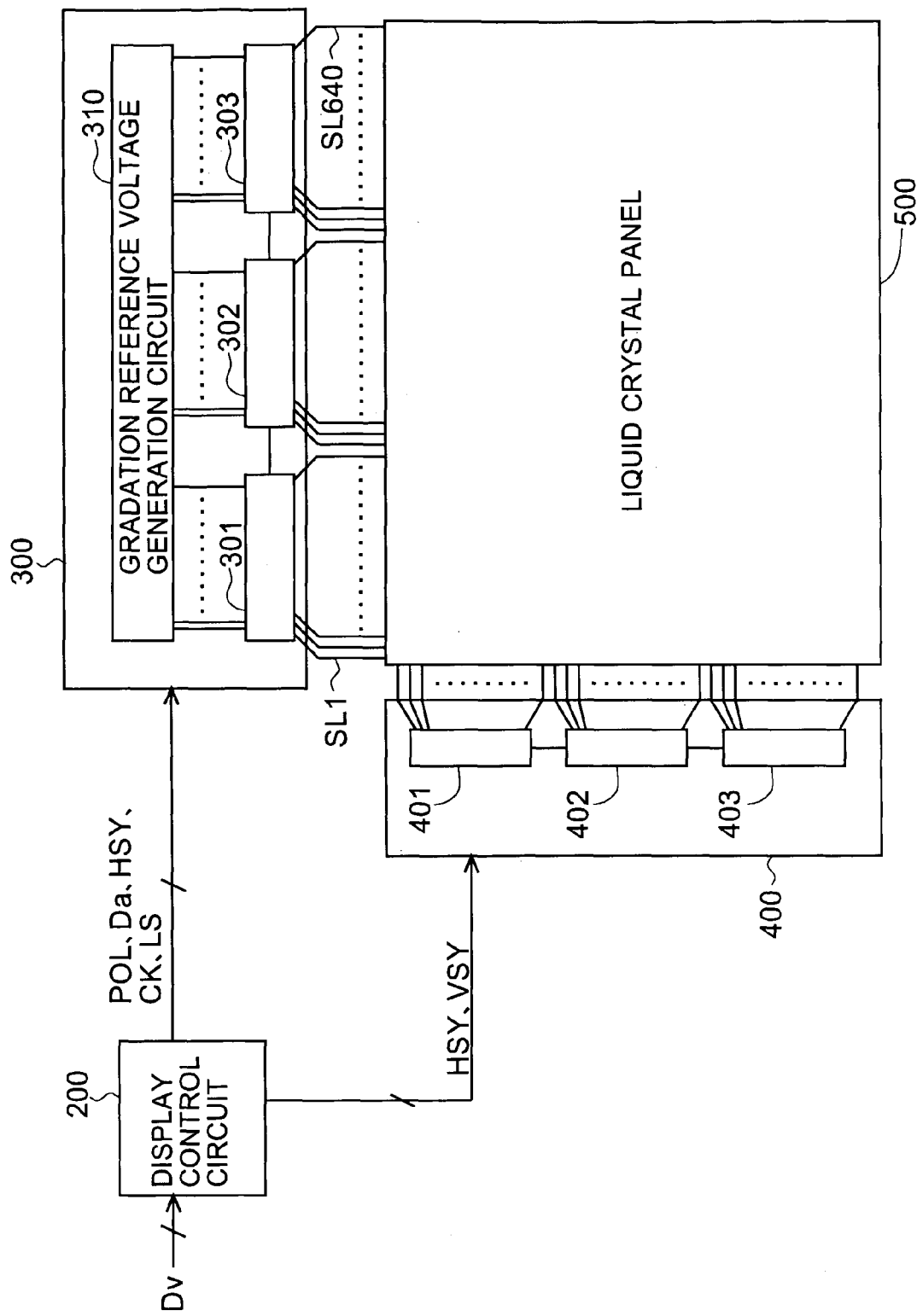
FIG. 1 is a block diagram illustrating the overall configuration of a liquid crystal display device according to an embodiment of the present invention.

31 shift register
32 first latch circuit
33 second latch circuit
36 error diffusion operation circuit
200 display control circuit
300 source driver (video signal line drive circuit)
301 to 303 source driver units (video signal line drive units)

310 gradation reference voltage generation circuit
361 error diffusion processing section
362 timing signal generation section
400 gate driver (scanning signal line drive circuit)
500 liquid crystal panel
3611 vertical addition section
3612 horizontal addition section
3613 error detection section
3614 horizontal delay section
3615 vertical delay section

BEST MODE FOR CARRYING OUT THE INVENTION

1. Overall Configuration and Operation

FIG. 1 is a block diagram illustrating the overall configuration of a liquid crystal display device according to an embodiment of the present invention. The liquid crystal display device is provided with a display control circuit 200, a source driver (video signal line drive circuit) 300, a gate driver (scanning signal line drive circuit) 400, and a liquid crystal panel 500. The source driver 300 includes three source driver units 301 to 303, and a gradation reference voltage generation circuit 310. The gate driver 400 includes three gate driver units 401 to 403. The liquid crystal panel 500 has video signal lines and scanning signal lines arranged in a matrix form. The liquid crystal display device has a horizontal resolution of 480 dots. Specifically, four hundred eighty video signal lines SL1 to SL480 are connected to the source driver 300. Of the video signal lines SL1 to SL480, the video signal lines SL1 to SL160 in the first to one hundred sixtieth columns are connected to the source driver unit 301, the video signal lines SL161 to SL320 in the one hundred sixty-first to three hundred twentieth columns are connected to the source driver unit 302, and the video signal lines SL321 to SL480 in the three hundred twenty-first to four hundred eightieth columns are connected to the source driver unit 303. The source driver units are cascaded in the following order: the source driver unit 301, the source driver unit 302, and the source driver unit 303. The source driver composed of three cascaded source driver units as in the present embodiment is referred to as a "source driver composed of three stages of source driver units".

The display control circuit 200 externally receives image data Dv, and generates a polarity control signal POL for controlling the polarity of a gradation reference voltage, display image data Da, a clock signal CK for controlling the timing of displaying an image on the liquid crystal panel 500, a latch strobe signal LS, a horizontal synchronization signal HSY, and a vertical synchronization signal VSY. The gradation reference voltage generation circuit 310 generates gradation reference voltages GV0 to GV63 for 64 gradations in accordance with the polarity control signal POL. The source driver units 301 to 303 generate video signals for driving the liquid crystal panel 500 based on the gradation reference voltages GV0 to GV63, the image signal Da, the horizontal synchronization signal HSY, the clock signal CK and the latch strobe signal LS. The gate driver units 401 to 403 generate scanning signals for sequentially selecting the scanning signal lines in units of one horizontal scanning period in accordance with the horizontal synchronization signal HSY and the vertical synchronization signal VSY. Then, the video signals are applied to the video signal lines and the scanning signals are applied to the scanning signal lines, thereby displaying an image on the liquid crystal panel 500. Although the three source driver units 301 to 303 are provided in the present embodiment, the number of source driver units is not restrictive and a suitable number can be selected depending on, for example, a required display capacity (the number of pixels per frame). The same can be applied to the gate driver units.

2. Source Driver

Figure 2:
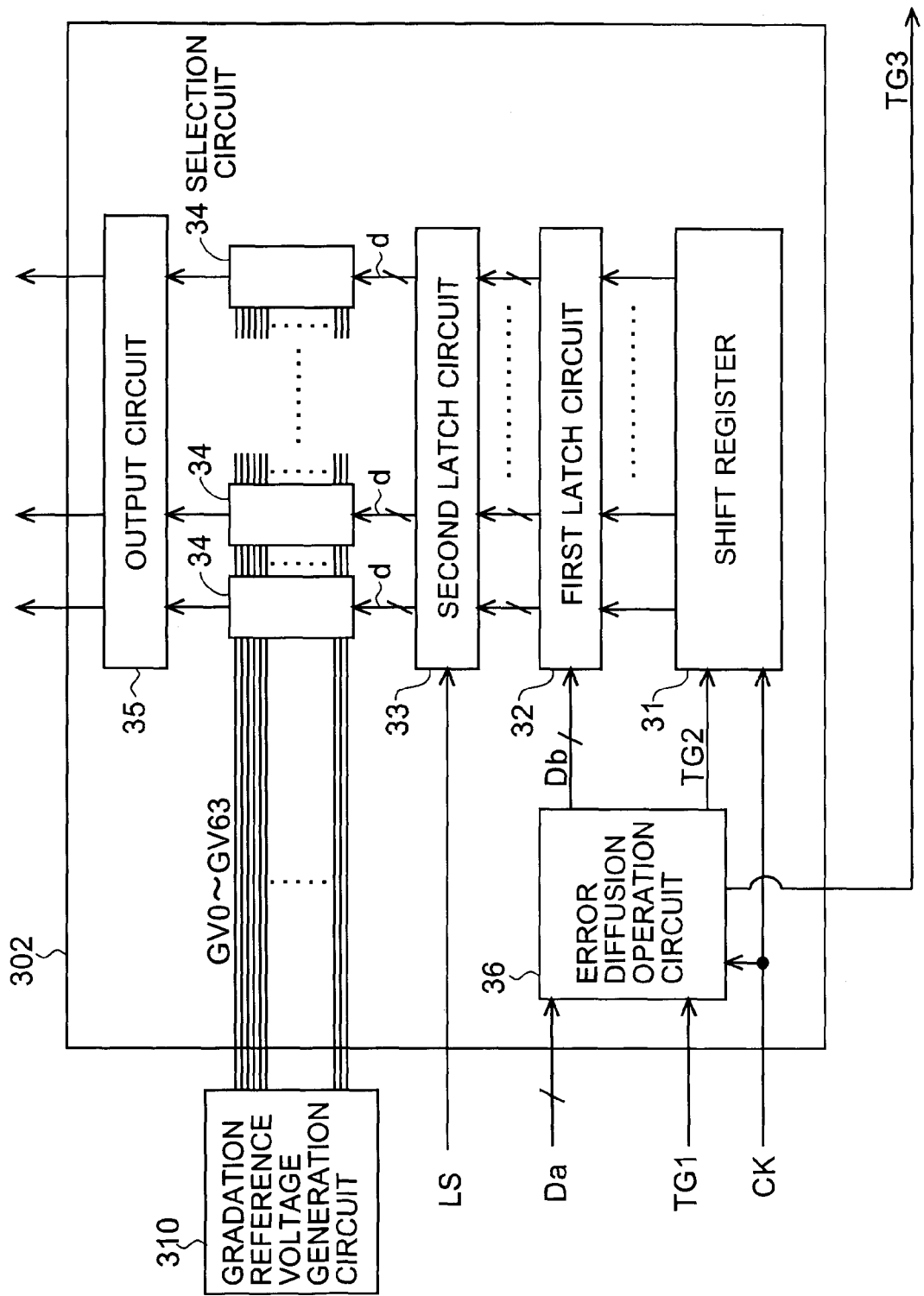
FIG. 2 is a block diagram illustrating the configuration of a source driver unit in the embodiment.

FIG. 2 is a block diagram illustrating the configuration of a source driver unit in the present embodiment. The source driver unit denoted by reference character 302 in FIG. 1 is described herein by way of example. The source driver unit 302 is provided with a shift register 31, a first latch circuit 32, a second latch circuit 33, a selection circuit 34, an output circuit 35, and an error diffusion operation circuit 36.

The error diffusion operation circuit 36 receives the image data Da, the clock signal CK and a first timing signal TG1, and outputs error-diffused image data Db, a second timing signal TG2 and a third timing signal TG3. Note that the third timing signal TG3 outputted from the error diffusion operation circuit 36 of the source driver unit 302 is received as a first timing signal TG1 by an error diffusion operation circuit 36 of the source driver unit 303. In addition, the error diffusion operation circuit 36 performs a process for diffusing an error of each pixel based on the image data Da, which will be described in detail below.

The shift register 31 receives the clock signal CK outputted from the display control circuit 200 and the second timing signal TG2 outputted from the error diffusion operation circuit 36, and generates sampling pulses. The first latch circuit 32 samples the error-diffused image data Db as 6-bit data in accordance with the timing of the sampling pulse outputted from the shift register 31. The second latch circuit 33 holds the error-diffused image data Db, which has been held at a different time for each video signal line by the first latch circuit 32, at the same time for all video signal lines in accordance with the latch strobe signal LS. The second, latch circuit 33 outputs the error-diffused image data Db as an internal image signal d. The selection circuit 34 selects any of the gradation reference voltages GV0 to GV63 for 64 gradations in accordance with the internal image signal d outputted from the second latch circuit 33, and outputs the selected gradation reference voltage as an analog voltage signal. The output circuit 35 performs impedance conversion on the analog voltage signal outputted from the selection circuit 34, and outputs video signals.

3. Error Diffusion Operation Process

Figure 3:
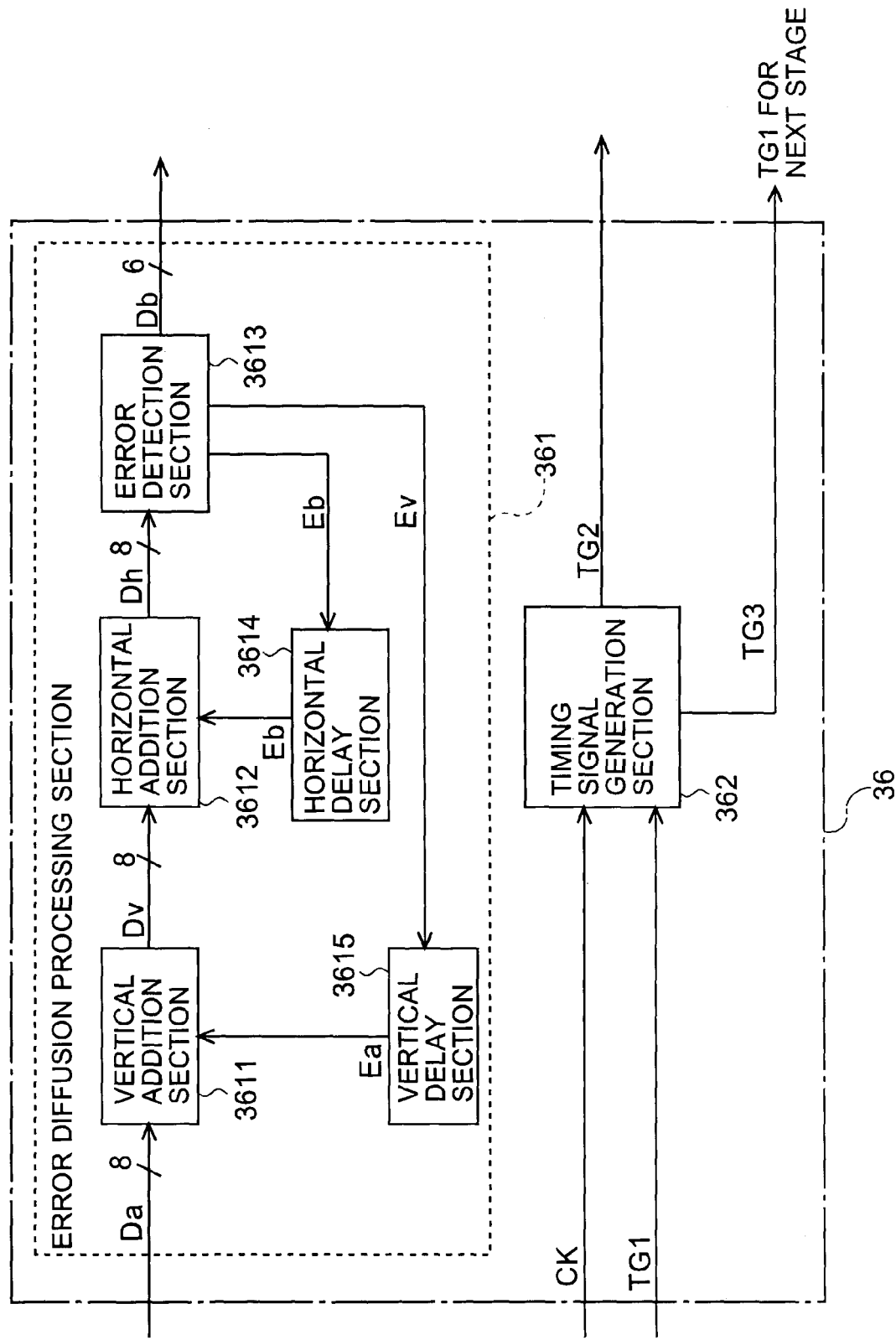
FIG. 3 is a block diagram illustrating the detailed configuration of an error diffusion operation circuit in the embodiment.

FIG. 3 is a block diagram illustrating the detailed configuration of the error diffusion operation circuit 36. The error diffusion operation circuit 36 generates data (error-diffused image data) Db representing for each pixel a gradation level that reflects an error according to the error diffusion method. Unlike the conventional art, which generates the error-diffused image data Db based on image data (self-stage area image data) Da for generating video signals that are to be provided to video signal lines (self-stage area video signal lines) in the one hundred sixty-first to three hundred twentieth columns, the error diffusion operation circuit 36 of the source driver unit 302 in the present embodiment generates the error-diffused image data Db based on image data Da for generating video signals that are to be provided to video signal lines in the one hundred fifty-eighth to three hundred twenty-third columns. Specifically, in the present embodiment, the error-diffused image data Db is generated based on, in addition to the image data Da for the display block of the source driver unit 302, image data (previous stage area image data) Da, which is contained in the image data Da for the display block of the source driver unit 301 and used for generating video signals that are to be provided to video signal lines (previous stage area video signal lines) in the one hundred fifty-eighth to one hundred sixtieth columns, and image data (subsequent stage area image data) Da, which is contained in the image data Da for the display block of the source driver unit 303 and used for generating video signals that are to be provided to video signal lines (subsequent stage area video signal lines) in the three hundred twenty-first to three hundred twenty-third columns. Note that the process for generating the error-diffused image data Db is referred to herein as the "error diffusion operation process".

The error diffusion operation circuit 36 includes an error diffusion processing section 361 and a timing signal generation section 362, and the error diffusion processing section 361 includes a vertical addition section 3611, a horizontal addition section 3612, an error detection section 3613, a horizontal delay section 3614, and a vertical delay section 3615. The vertical addition section 3611 adds an error represented by previous row error data Ea outputted from the vertical delay section 3615, which will be described later, to a gradation level represented for each pixel by the image data Da received from the display control circuit 200, and outputs data (hereinafter, referred to as "previous row error-reflected image data") Dv, which represents a gradation level reflecting an error for a previous row (hereinafter, referred to as a "previous row error") and also represents each pixel by eight bits. The horizontal addition section 3612 adds an error represented by previous column error data Eb outputted from the horizontal delay section 3614, which will be described later, to a gradation level represented for each pixel by the previous row error-reflected image data Dv, and outputs data (hereinafter, referred to as "previous column error-reflected image data") Dh, which represents a gradation level reflecting an error for a previous column (hereinafter, referred to as a "previous column error") and also represents each pixel by eight bits.

Figure 8:
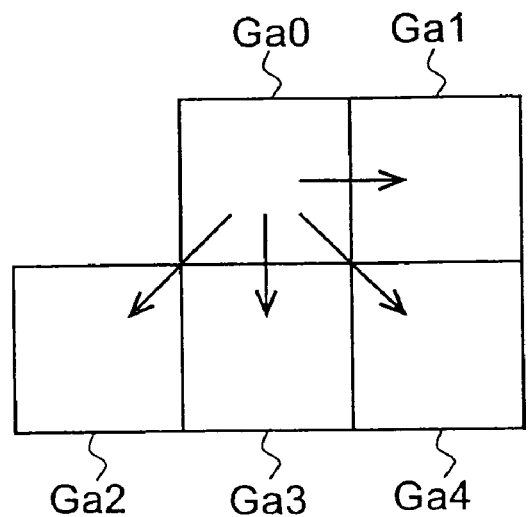
FIG. 8 is a diagram for explaining an error diffusion process in the example of conventional art.

The error detection section 3613 receives the previous column error-reflected image data Dh in which each pixel is represented by eight bits, and outputs upper six bits of each pixel as error-diffused image data Db, while outputting, for each pixel, previous column error data Eb, which represents an error that is to be added to a gradation level represented by image data Da for another pixel in the same row but in a column next to the column to which the pixel belongs, as well as vertical error data Ev, which represents an error that is to be added to a gradation level represented by image data Da for another pixel in a row next to the row to which the pixel belongs. Looking at the pixel Ga0 in FIG. 8, for example, data representing a portion of an error caused to the pixel Ga0 that is to be reflected in the pixel Ga1 becomes the previous column error data Eb. In addition, pieces of data respectively representing portions of the error caused to the pixel Ga0 that are to be reflected in the pixels Ga2, Ga3 and Ga4 become the vertical error data Ev.

Figure 9:
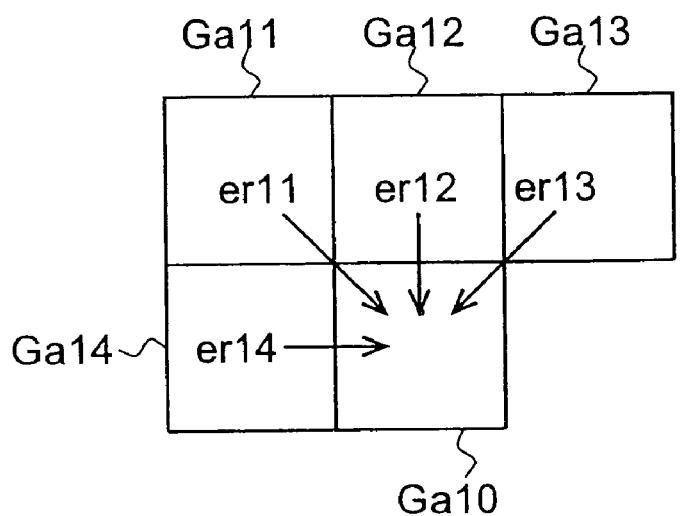
FIG. 9 is a diagram for illustrating addition of errors to the original image gradation level of a pixel in the example of conventional art.

The horizontal delay section 3614 receives previous column error data Eb, and outputs it after holding it for a time period corresponding to one clock. The vertical delay section 3615 receives vertical error data Ev, and holds it for a time period until the vertical addition section 3611 receives image data Da for a pixel in which an error represented by the vertical error data Ev is to be reflected. In addition, synchronously with the timing when the vertical addition section 3611 receives image data Da for each pixel, the vertical delay section 3615 outputs, as previous row error data Ea, the sum of errors represented by the vertical error data Ev that are to be reflected in the gradation level of the pixel. Looking at the pixel Ga10 in FIG. 9, for example, the sum of errors caused to the pixels Ga11, Ga12 and Ga13 that are to be reflected in the gradation level of the pixel Ga10 (er11+er12+er13) is outputted as the previous row error data Ea.

Figure 4:
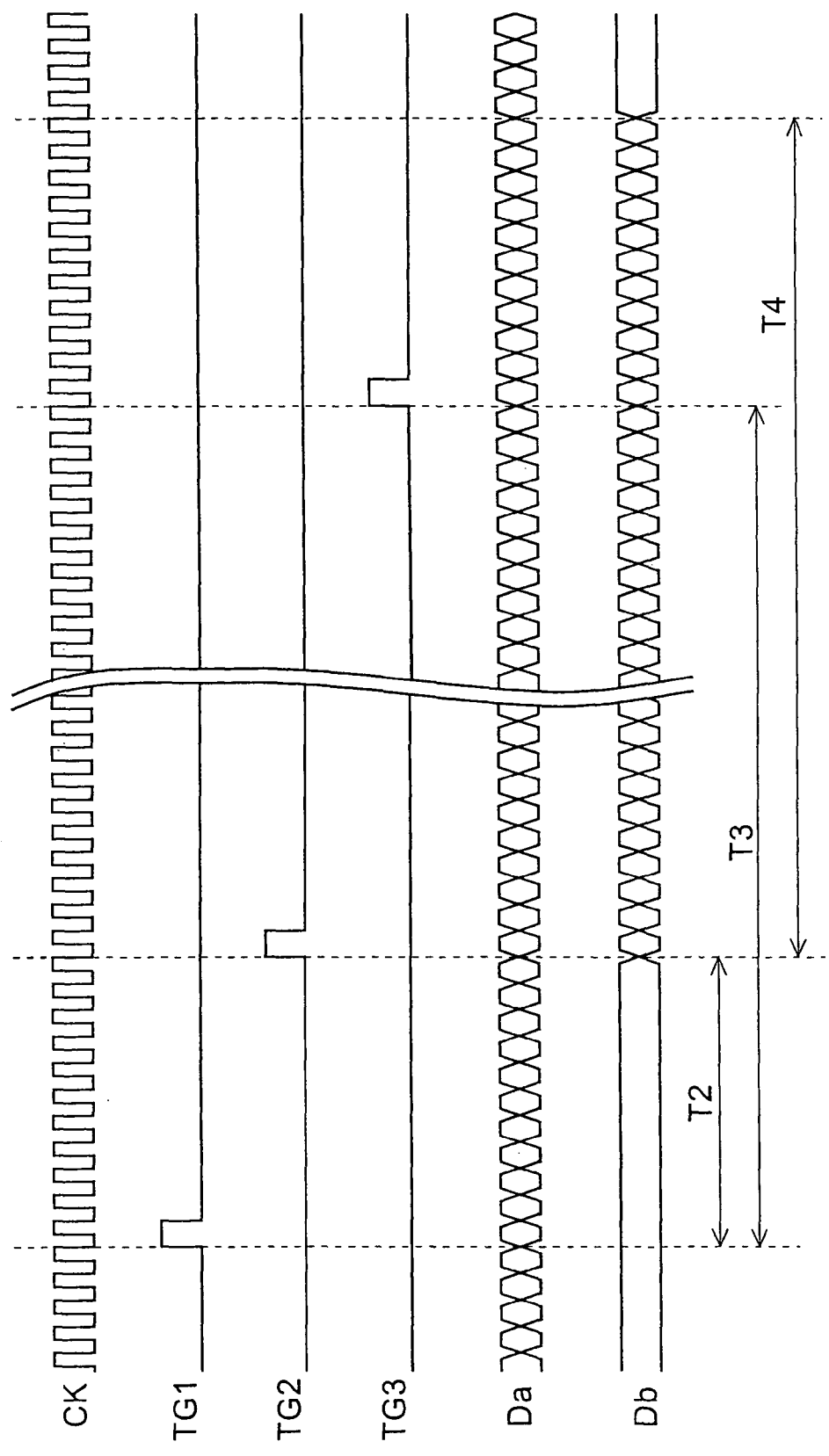
FIG. 4 is a signal waveform diagram of an error diffusion operation circuit in an example of conventional art.
Figure 5:
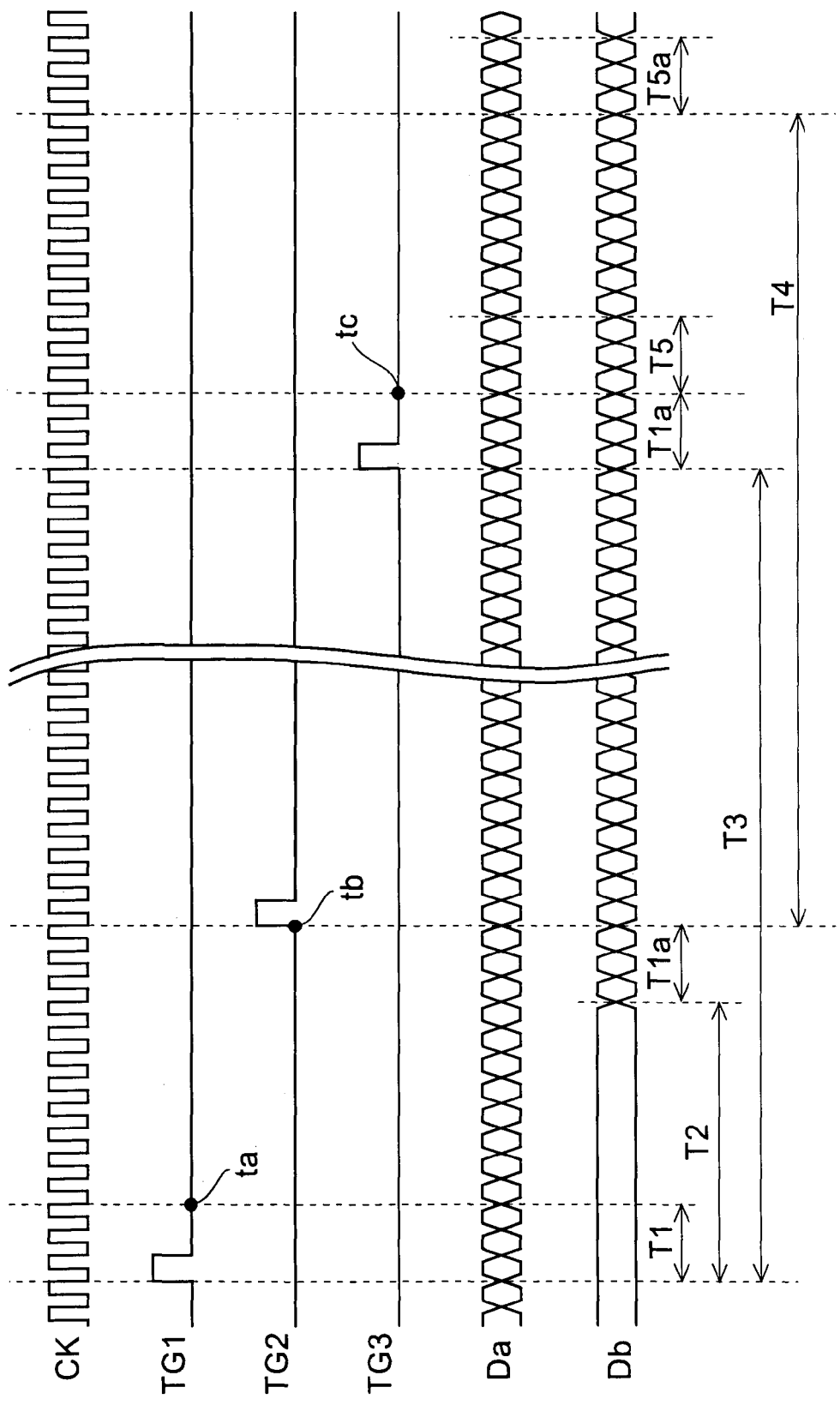
FIG. 5 is a signal waveform diagram of an error diffusion operation circuit in the embodiment.

The timing signal generation section 362 receives a clock signal CK and a first timing signal TG1, and outputs a second timing signal TG2 and a third timing signal TG3. The error diffusion operation circuit 36 configured as shown in FIG. 3 is conventionally known, and a signal waveform diagram for the first to third timing signals TG1 to TG3, etc., in the conventional art is as shown in FIG. 4. On the other hand, a signal waveform diagram for the first to third timing signals TG1 to TG3, etc., in the present embodiment is as shown in FIG. 5. In FIGS. 4 and 5, time periods denoted by reference characters T2, T3 and T4 respectively represent a time period required by the error diffusion operation circuit 36 for generating error-diffused image data Db after receiving image data Da for each pixel, a time period in which the error diffusion operation circuit 36 receives self-stage area image data, and a time period in which the error diffusion operation circuit 36 outputs error-diffused image data Db that is to be provided to the self-stage area video signal lines. In addition, time periods denoted by reference characters T1 and T5 in FIG. 5 respectively represent a time period in which the error diffusion operation circuit 36 receives previous stage area image data, and a time period in which the error diffusion operation circuit 36 receives subsequent stage area image data. In addition, time periods denoted by reference characters T1a and T5a in FIG. 5 respectively represent a time period corresponding to the time period denoted by reference character T1, and a time period corresponding to the time period denoted by reference character T5. Furthermore, time points denoted by reference characters ta, tb and tc in FIG. 5 respectively represent a time point at which the first timing signal TG1 is activated, a time point at which the second timing signal TG2 is activated, and a time point at which the third timing signal TG3 is activated in the example of conventional art. Note that for the above process, configurations other than the timing signal generation section 362 can be realized by the same configurations as those used conventionally.

In the error diffusion operation circuit 36, an error diffusion operation process is started when the first timing signal TG1 is activated. After a lapse of the time period T2 since the start of the error diffusion operation process, the error diffusion operation circuit 36 starts outputting the error-diffused image data Db. In addition, when the second timing signal TG2 is activated, the shift register 31 shown in FIG. 2 starts outputting sampling pulses to the first latch circuit 32. Further, after a lapse of the time period T3 since the activation of the first timing signal TG1, the third timing signal TG3 is activated. In the present embodiment, as shown in FIG. 5, the time at which the first timing signal TG1 is activated is earlier by the time period T1 than in the example of conventional art. Accordingly, the time at which to start outputting the error-diffused image data Db is earlier by the time period T1 than in the example of conventional art. As a result of this, the third timing signal TG3 is also outputted earlier by the time period T1 than in the example of conventional art. On the other hand, the present embodiment and the example of conventional art are the same in terms of the time at which the second timing signal TG2 is activated. In addition, the time period in which to perform the error diffusion operation process is longer than in the example of conventional art by a time period corresponding to the sum of the time periods T1 and T5. This is realized by, for example, causing the error diffusion operation process to be performed only for a predetermined time period.

Note that as the first timing signal TG1, a horizontal synchronization signal HSY is inputted to the error diffusion operation circuit 36 of the source driver 301. The time at which the horizontal synchronization signal HSY is activated is the same as the time at which the first timing signal TG1 is activated in the example of conventional art. The reason for this is that the source driver 301 is not required to reflect the result of the error diffusion operation process based on the previous stage area image data. In addition, the time period in which to perform the error diffusion operation process in the error diffusion operation circuit 36 of the source driver 303 is longer by the time period T1 than in the conventional art. The reason for this is that the source driver 303 is not required to reflect the result of the error diffusion operation process based on the subsequent stage area image data.

4. Action and Effect

The action and effect of the present embodiment will now be described. As described above, according to the present embodiment, the time to start the error diffusion operation process becomes earlier than in the example of conventional art by a time period in which the error diffusion operation circuit 36 receives the previous stage area image data. In addition, the time period in which to perform the error diffusion operation process becomes longer than in the example of conventional art by a time period corresponding to the sum of the time period in which to receive the previous stage area image data and the time period in which to receive the subsequent stage area image data. Therefore, in the source driver unit 302 in the present embodiment, the error diffusion operation process is performed for each pixel based on image data Da for the one hundred fifty-eighth to three hundred twenty-third columns. As a result, when the error diffusion operation process is performed on pixels, for example, in the one hundred sixty-first column, error diffusion operation process results for pixels in the one hundred fifty-eighth to one hundred sixtieth columns are also reflected. Similarly, when the error diffusion operation process is performed on pixels, for example, in the three hundred twentieth column, error diffusion operation process results for pixels in the three hundred twenty-first to three hundred twenty-third columns are also reflected. That is, at a boundary of a display block, when calculating gradation levels of pixels included in the display block targeted for display, errors for pixels included in its adjacent display block are incorporated. In addition, the third timing signal TG3 outputted from each source driver unit is received as the first timing signal TG1 by a source driver unit in the next stage. Therefore, even if the source driver is composed of four or more source driver units, when the error diffusion operation process is performed in each source driver unit, error diffusion operation process results based on image data Da for display blocks of source driver units before and after that source driver unit are also reflected.

Figure 6:
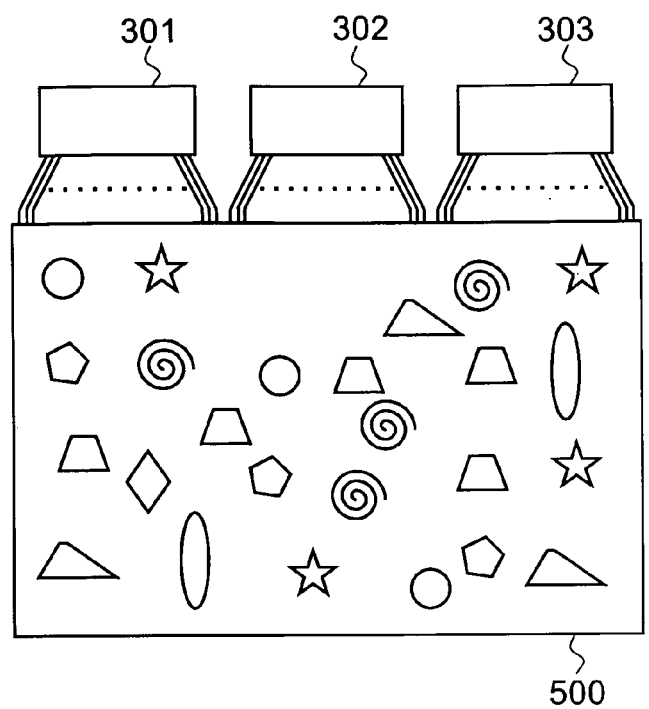
FIG. 6 is a diagram illustrating an exemplary display screen in the embodiment.
Figure 7:
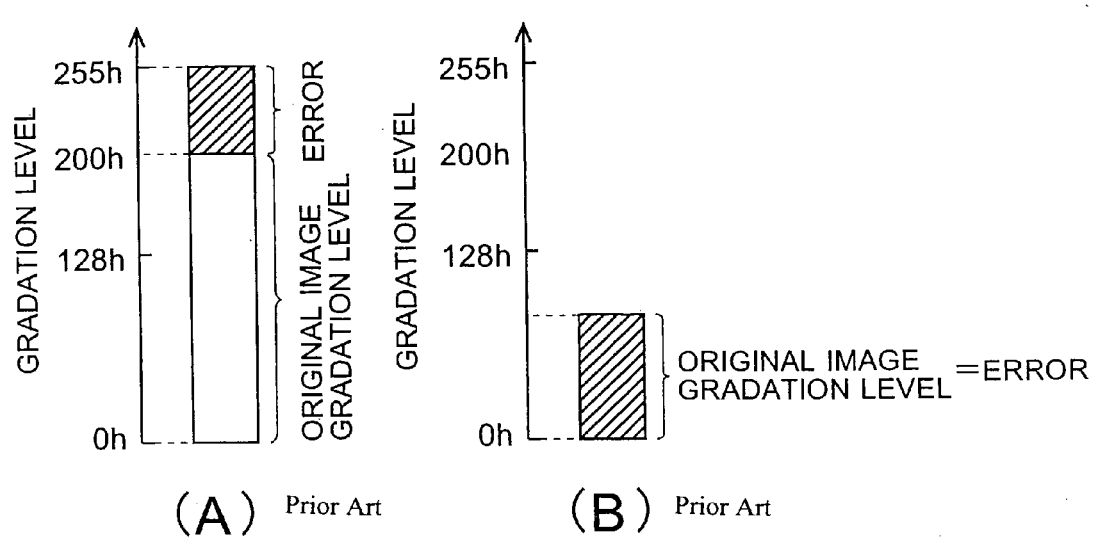
FIG. 7A is a representation for explaining an error in the case of an original image gradation level of 200 h in the example of conventional art.
FIG. 7B is a representation for explaining an error in the case of an original image gradation level of 80 h in the example of conventional art.
Figure 10:
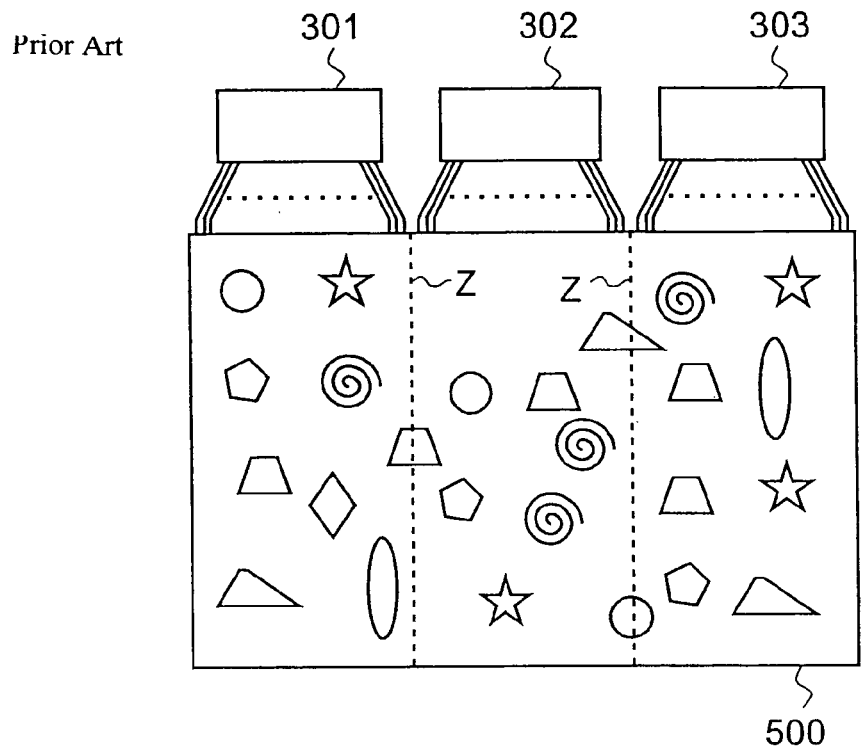
FIG. 10 is a diagram illustrating an exemplary display screen in the example of conventional art.
Figure 11:
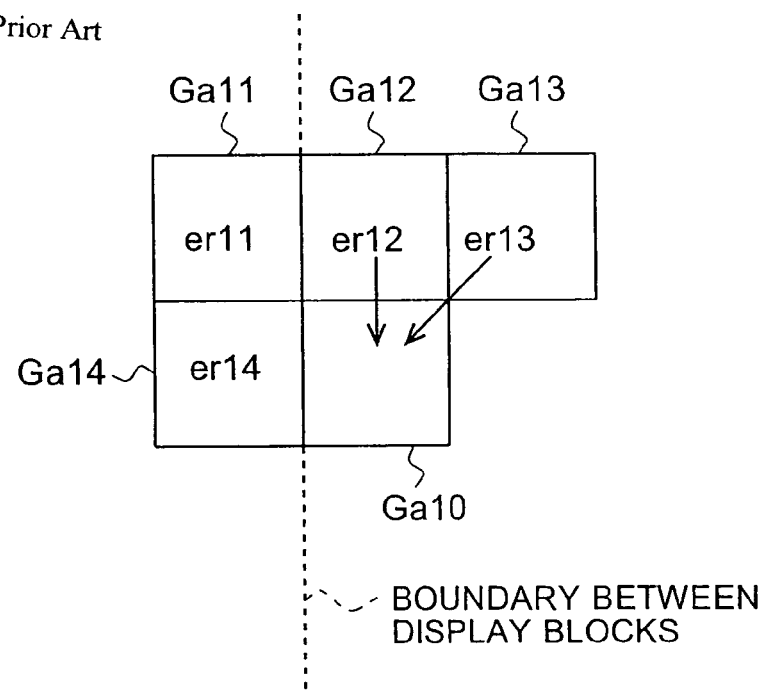
FIG. 11 is a diagram for explaining an error diffusion process at a boundary of a display block in the example of conventional art.

Thus, while in the example of conventional art, vertical stripes are visually recognized on the display screen as shown in FIG. 10, in the present embodiment, no vertical stripe is visually recognized on the display screen as shown in FIG. 6. As such, in the present embodiment, a display with a smooth gradation change is provided even at boundaries of display blocks.

5. Others

While the above embodiment has been described by taking as an example the liquid crystal display device, the present invention is not limited to this. The invention is applicable to any image display device that includes a plurality of drivers for image display, each driving signal lines for displaying an image in a predetermined area, and that employs the error diffusion method in order to realize a pseudo multi-gradation display.

In the above embodiment, for the purpose of the error diffusion process, a piece of image data for three columns is acquired from a display block of a source driver unit in the previous stage, and also another piece of image data for three columns is acquired from a display block of a source driver unit in the subsequent stage, but the present invention is not limited to this. The number of video signal lines through which the image data is acquired from the display block of the source driver unit in the previous stage and the number of video signal lines through which the image data is acquired from the display block of the source driver unit in the subsequent stage may differ from each other, so long as these numbers are determined in accordance with each pixel's allocation rates of error diffusion to its neighboring pixels. Furthermore, it may be that the image data for only one of the source driver unit in the previous stage and the source driver unit in the subsequent stage is acquired.

The invention claimed is:

1. A video signal line drive circuit connected to a display portion for displaying an image, the circuit comprising:
    a plurality stage of video signal line drive units for converting, by an error diffusion method, a gradation level indicated by an externally inputted image signal representing an original image, and applying a video signal indicating a gradation level after the conversion to video signal lines each included in a predetermined area of the display portion,
    wherein each video signal line drive unit in each stage includes an error diffusion operation circuit for generating a video signal that is to be applied to self-stage area video signal lines, which are video signal lines connected to self-stage, based on self-stage area image data and at least either previous stage area image data or subsequent stage area image data, the self-stage area image data being image data representing the original image for the video signal that is to be applied to the self-stage area video signal lines, the previous stage area image data being image data representing the original image for the video signal that is to be applied to previous stage area video signal lines, which are a predetermined number of near-boundary video signal lines among all video signal lines connected to the video signal line drive unit in a previous stage, the subsequent stage area image data being image data representing the original image for the video signal that is to be applied to subsequent stage area video signal lines, which are a predetermined number of near-boundary video signal lines among all video signal lines connected to the video signal line drive unit in a subsequent stage.

2. The video signal line drive circuit according to claim 1, wherein each video signal line drive unit is cascaded to a video signal line drive unit in a previous stage and a video signal line drive unit in a subsequent stage,
    wherein the error diffusion operation circuit included in each video signal line drive unit includes a timing signal generation section for receiving a first timing signal, which is activated at a predetermined time, and generating a second timing signal for timing to sample the video signal that is to be applied to the self-stage area video signal lines, and a third timing signal that is received as the first timing signal by the video signal line drive unit in the subsequent stage, wherein the second timing signal is activated after a lapse of a time period corresponding to a time period elapsed after the first timing signal is activated in which the error diffusion operation circuit receives the previous stage area image data and thereafter a portion of the image signal representing the original image that corresponds to one pixel is converted by the error diffusion method, wherein the third timing signal is activated after a lapse of a time period corresponding to a time period elapsed after the first timing signal is activated in which the error diffusion operation circuit receives the self-stage area image data, and wherein a process for converting the gradation level indicated by the image signal representing the original image by the error diffusion method is started synchronously with the time at which the first timing signal is activated.

3. A display device comprising:

a display portion for displaying an image; and a video signal line drive circuit connected to the display portion and composed of a plurality stage of video signal line drive units for converting, by an error diffusion method, a gradation level indicated by an externally inputted image signal representing an original image, and applying a video signal indicating a gradation level after the conversion to video signal lines each included in a predetermined area of the display portion, wherein each video signal line drive unit includes an error diffusion operation circuit for generating a video signal that is to be applied to self-stage area video signal lines, which are video signal lines connected to self-stage, based on self-stage area image data and at least either previous stage area image data or subsequent stage area image data, the self-stage area image data being image data representing the original image for the video signal that is to be applied to the self-stage area video signal lines, the previous stage area image data being image data representing the original image for the video signal that is to be applied to previous stage area video signal lines, which are a predetermined number of near-boundary video signal lines among all video signal lines connected to the video signal line drive unit in a previous stage, the subsequent stage area image data being image data representing the original image for the video signal that is to be applied to subsequent stage area video signal lines, which are a predetermined number of near-boundary video signal lines among all video signal lines connected to the video signal line drive unit in a subsequent stage.

4. The display device according to claim 3, wherein each video signal line drive unit is cascaded to a video signal line drive unit in a previous stage and a video signal line drive unit in a subsequent stage, wherein the error diffusion operation circuit included in each video signal line drive unit includes a timing signal generation section for receiving a first timing signal, which is activated at a predetermined time, and generating a second timing signal for timing to sample the video signal that is to be applied to the self-stage area video signal lines, and a third timing signal that is received as the first timing signal by the video signal line drive unit in the subsequent stage, wherein the second timing signal is activated after a lapse of a time period corresponding to a time period elapsed after the first timing signal is activated in which the error diffusion operation circuit receives the previous stage area image data and thereafter a portion of the image signal representing the original image that corresponds to one pixel is converted by the error diffusion method, wherein the third timing signal is activated after a lapse of a time period corresponding to a time period elapsed after the first timing signal is activated in which the error diffusion operation circuit receives the self-stage area image data, and wherein a process for converting the gradation level indicated by the image signal representing the original image by the error diffusion method is started synchronously with the time at which the first timing signal is activated.

* * * * *